(12) United States Patent
Li et al.

(10) Patent No.: US 8,980,705 B2
(45) Date of Patent: Mar. 17, 2015

(54) MOS TRANSISTORS AND FABRICATION METHOD THEREOF

(71) Applicant: Semiconductor Manufacturing International (Shanghai) Corporation, Shanghai (CN)

(72) Inventors: Fenglian Li, Shanghai (CN); Jinghua Ni, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 1 day.

(21) Appl. No.: 14/096,286

(22) Filed: Dec. 4, 2013

(65) Prior Publication Data

US 2015/0035084 A1 Feb. 5, 2015

(30) Foreign Application Priority Data

Aug. 5, 2013 (CN) .......................... 2013 1 0338368

(51) Int. Cl.
*H01L 21/338* (2006.01)
*H01L 29/78* (2006.01)
*H01L 29/66* (2006.01)

(52) U.S. Cl.
CPC .......... *H01L 29/78* (2013.01); *H01L 29/66545* (2013.01); *H01L 29/66606* (2013.01)
USPC .......................................................... 438/183

(58) Field of Classification Search
CPC .............. H01L 29/78; H01L 29/66545; H01L 29/66606
USPC ......... 438/591, 300, 586, 401, 597, 305, 199, 438/183
See application file for complete search history.

(56) References Cited

U.S. PATENT DOCUMENTS

| | | | |
|---|---|---|---|
| 7,977,181 B2 * | 7/2011 | Lai et al. ........................ | 438/199 |
| 2008/0105920 A1 * | 5/2008 | Hirano et al. .................. | 257/327 |
| 2011/0143529 A1 * | 6/2011 | Lee et al. ...................... | 438/591 |
| 2012/0205728 A1 * | 8/2012 | Yin et al. ...................... | 257/288 |
| 2013/0017678 A1 * | 1/2013 | Tsai et al. ..................... | 438/591 |
| 2013/0240990 A1 * | 9/2013 | Yin et al. ...................... | 257/343 |

* cited by examiner

*Primary Examiner* — Bilkis Jahan
(74) *Attorney, Agent, or Firm* — Anova Law Group, PLLC

(57) ABSTRACT

A method is provided for fabricating an MOS transistor. The method includes providing a semiconductor substrate; and forming a ploy silicon dummy gate structure having a high-K gate dielectric layer, a high-K gate dielectric protection layer containing nitrogen and a poly silicon dummy gate on the semiconductor substrate. The method also includes forming a source region and a drain region in the semiconductor substrate at both sides of the poly silicon dummy gate structure. Further, the method includes removing the poly silicon dummy gate to form a trench exposing the high-K gate dielectric protection layer containing nitrogen and performing a nitrogen treatment process to repair defects in the high-K gate dielectric protection layer containing nitrogen caused by removing the poly silicon dummy gate. Further, the method also includes forming a metal gate structure in the trench.

20 Claims, 4 Drawing Sheets

MOS TRANSISTORS AND FABRICATION METHOD THEREOF

CROSS-REFERENCES TO RELATED APPLICATIONS

This application claims the priority of Chinese patent application No. 201310338368.4, filed on Aug. 5, 2013, the entirety of which is incorporated herein by reference.

FIELD OF THE INVENTION

The present invention generally relates to the field of semiconductor manufacturing technology and, more particularly, relates to MOS transistors and fabrication techniques thereof.

BACKGROUND

With the development of integrated circuit (IC) technology, the size of the semiconductor devices has become smaller and smaller. In order to lower the parasitic capacitance of the gates of MOS transistors and increase the device speed, a stacked layer structure with high dielectric constant (high-K) gate dielectric layer and a metal gate (may be referred as an HKMG structure) have been introduced into the MOS transistors. Further, in order to prevent the metal of the HKMG structure from affecting other structures of the MOS transistor, the HKMG structure may be formed by a gate-last process.

FIGS. 1~3 illustrate semiconductor structures corresponding to certain stages of an existing gate last process for forming the high-K metal gate of a MOS transistor.

As shown in FIG. 1, a semiconductor substrate 10 is provided, and a poly silicon dummy gate structure 20 and an interlayer dielectric layer 30 are sequentially formed on the semiconductor substrate 10. The poly silicon dummy gate structure 20 includes a high-K gate dielectric layer 21 on the surface of the semiconductor substrate 10, a functional high-K gate dielectric protection layer 22 on the high-K gate dielectric layer 21, and a poly silicon dummy gate 23 on the functional high-K gate dielectric protection layer 22. The surface of the interlayer dielectric layer 30 may level with the surface of the poly silicon dummy gate structure 20. Further, as shown in FIG. 2, the silicon dummy gate 23 is removed, and a trench 25 is formed. The bottom of the trench 25 exposes the surface of the functional high-K gate dielectric protection layer 22. Further, as shown in FIG. 3, a metal gate 26 is formed in the trench 25.

However, such a MOS transistor with the HKMG structure 20 may have a relatively high leakage current. The disclosed device structures and methods are directed to solve one or more problems set forth above and other problems.

BRIEF SUMMARY OF THE DISCLOSURE

One aspect of the present disclosure includes a method for fabricating a MOS transistor. The method includes providing a semiconductor substrate; and forming a ploy silicon dummy gate structure having a high-K gate dielectric layer, a high-K gate dielectric protection layer containing nitrogen and a poly silicon dummy gate on the semiconductor substrate. The method also includes forming a source region and a drain region in the semiconductor substrate at both sides of the poly silicon dummy gate structure. Further, the method includes removing the poly silicon dummy gate to form a trench exposing the high-K gate dielectric protection layer containing nitrogen and performing a nitrogen treatment process to repair defects in the high-K gate dielectric protection layer containing nitrogen caused by removing the poly silicon dummy gate. Further, the method also includes forming a metal gate structure in the trench.

Another aspect of the present disclosure includes a MOS transistor. The MOS transistor includes a semiconductor substrate, a source region and a drain region in the semiconductor substrate. The MOS transistor also includes an interfacial layer, a high-K gate dielectric layer and a metal gate structure having a work function layer and a metal gate 119. Further, the MOS transistor includes a high-K gate dielectric protection layer repaired by a nitrogen treatment process between the metal gate structure and the high-K dielectric layer. Further, the MOS transistor also includes an interlayer dielectric layer on the semiconductor substrate.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

A high-K gate dielectric layer and a high-K gate dielectric protection layer may be included in a poly silicon dummy gate structure, when the poly silicon gate of the poly silicon dummy gate structure is removed by an etching process, the high-K gate dielectric protection layer may be over etched by the etching process. Especially when high-K gate dielectric protection layer contains nitrogen, nitrogen bonds may be damaged by the over etching; and defects may be formed. A MOS transistor having such a high-K metal gate structure may have a relatively large leakage current. The present invention overcomes this problem and other related problems by repairing the high-K gate dielectric protection layer using a nitrogen treatment process.

Figure 8:
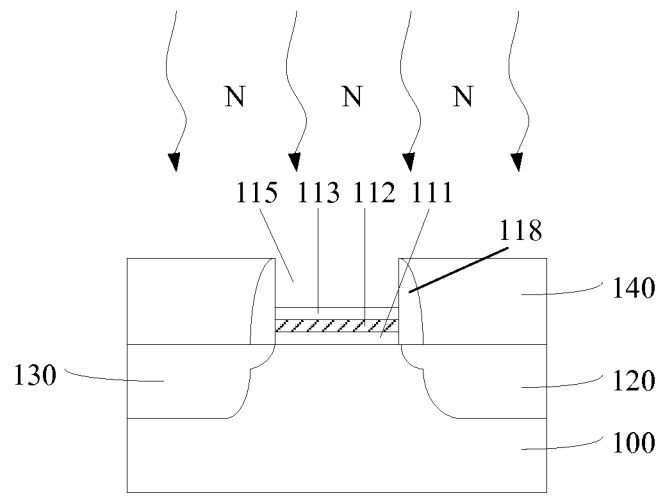
Figure 9:
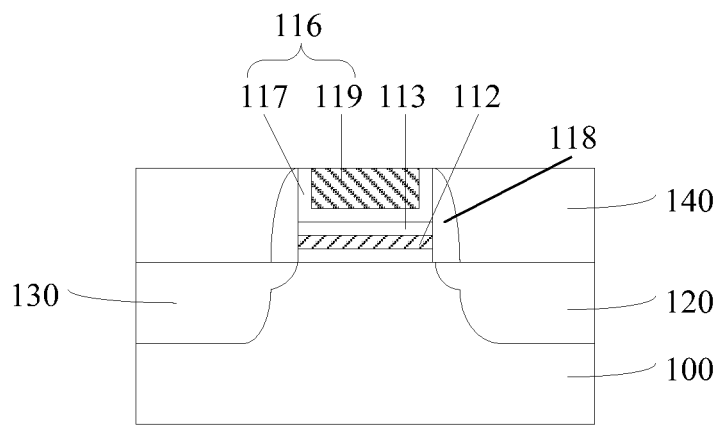
Figure 10:
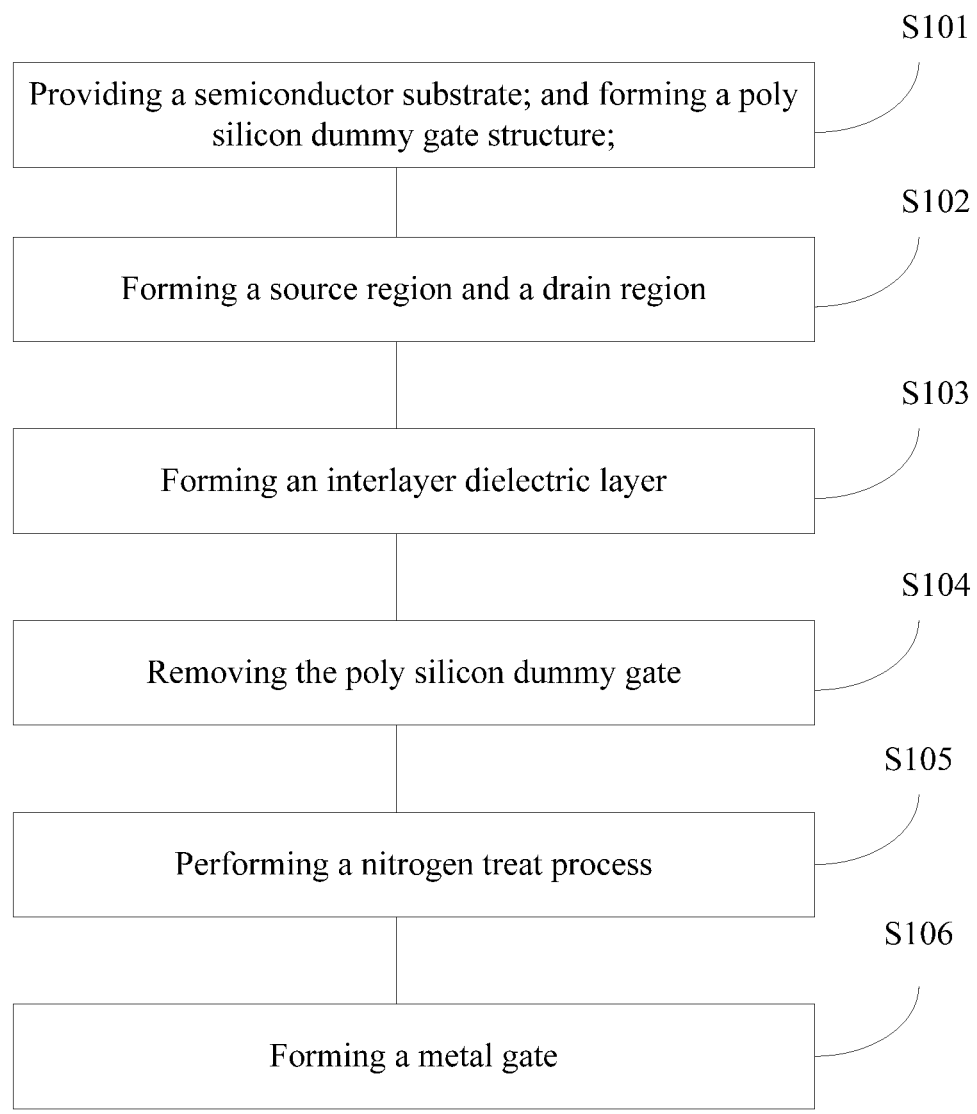
FIG. 10 illustrates an exemplary fabrication process of a MOS transistor consistent with the disclosed embodiments.

FIG. 10 illustrates an exemplary fabrication process of a MOS transistor; and FIGS. 4~9 illustrate exemplary semiconductor structures corresponding to various stages of the fabrication process.

Figure 1:
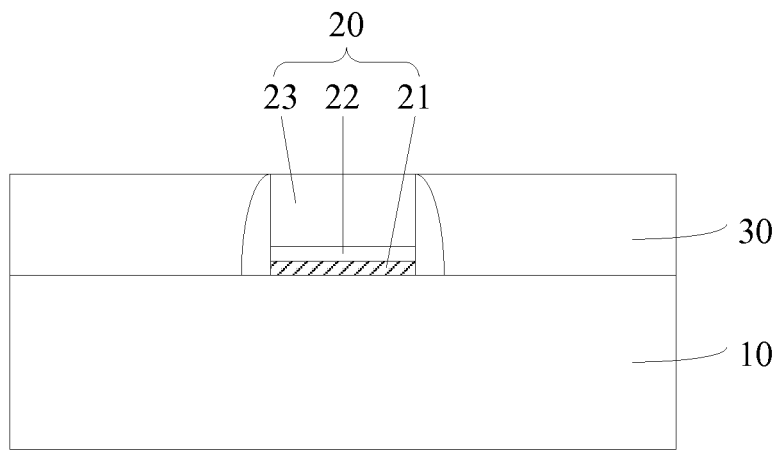
FIGS. 1~3 illustrate semiconductor structures corresponding to certain stages of an existing fabrication process of a high-metal gate structure.
Figure 2:
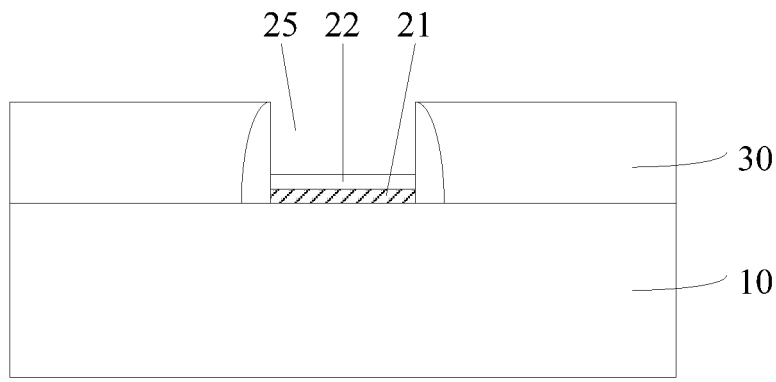
Figure 3:
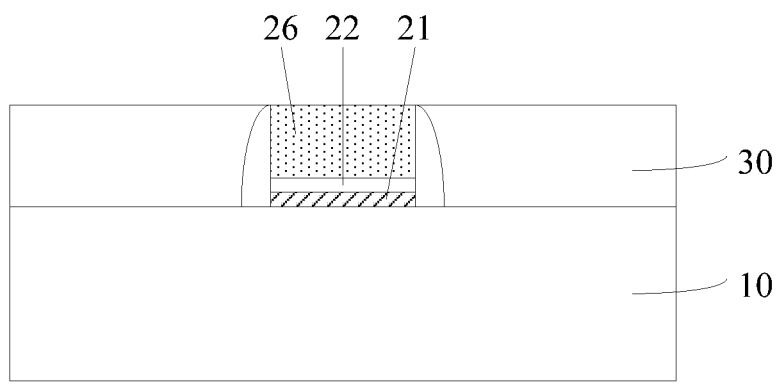
Figure 4:
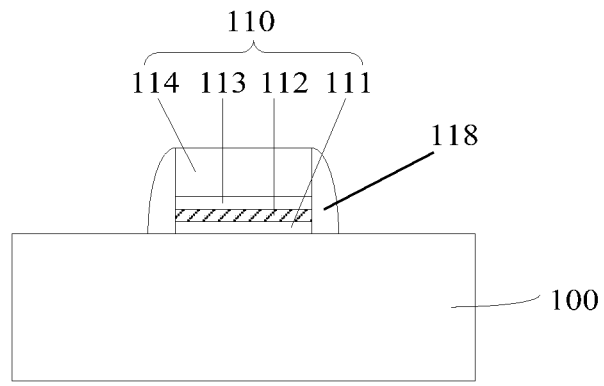
FIGS. 4~9 illustrate semiconductor structures corresponding to certain stages of an exemplary fabrication process of a MOS transistor consistent with the disclosed embodiments.

As shown in FIG. 10, at the beginning of the fabrication process, a semiconductor substrate with certain structures is provided (S101). FIG. 4 illustrates a corresponding semiconductor structure.

As shown in FIG. 4, a semiconductor substrate 100 is provided. The semiconductor substrate 100 may include any appropriate semiconductor materials, such as silicon, silicon on insulator (SOI), silicon germanium, carborundum, indium antimonide, lead telluride, indium arsenide, indium phosphide, gallium arsenidie, gallium antimonite, or ally semiconductor, etc. The semiconductor substrate 100 may be selected according to semiconductor devices formed on the semiconductor devices. The semiconductor substrate 100 provides a base for subsequent structures and processes.

After providing the semiconductor substrate 100, a poly silicon dummy gate structure 110 may be formed on the semiconductor substrate 100. As shown in FIG. 4, the poly silicon dummy gate structure 110 may include an interfacial layer 111 on one surface of the semiconductor substrate 100, a high-K gate dielectric layer 112 on the interfacial layer 111, a high-K gate dielectric protection layer 113 containing nitrogen on the high-K gate dielectric layer 112, and a poly silicon dummy gate 114 on the high-K gate dielectric protection layer 113. Other structures may be added and certain devices may be removed without departing from the principles of the disclosed embodiments. In certain other embodiments, other kinds of dummy gate structures with appropriate material may also be used.

Referring to FIG. 4, a process for forming the poly silicon dummy gate structure 110 may include forming an interfacial material layer (not shown) on the surface of the semiconductor substrate 100; forming a high-K gate dielectric material layer (not shown) on the interfacial material layer; forming a high-K gate dielectric protection material layer (not shown) containing nitrogen on the high-K gate dielectric material layer; forming a poly silicon layer (not shown) on the high-K gate dielectric protection material layer; forming a patterned photoresist layer (not shown) on the poly silicon layer; and sequentially etching the poly silicon material layer, the high-K gate dielectric protection material layer, the high-K gate dielectric material layer, and the interfacial material layer using the patterned photoresist layer as an etching mask. Therefore, the interfacial layer 111, the high-K gate dielectric layer 112, the high-K gate dielectric protection layer 113, and poly silicon dummy gate 114 are formed.

The high-K gate dielectric layer 112 may be made of any appropriate material, such as $HfO_2$, $La_2O_3$, HfSiON, or $HfAlO_3$, etc. Various processes may be used to form the high-K gate dielectric layer 112, such as a chemical vapor deposition (CVD) process, a physical vapor deposition (PVD) process, a flowable CVD (FCVD) process or an atomic layer deposition (ALD) process, etc.

Because the high-K gate dielectric layer 112 and the semiconductor substrate 100 may have a relatively large lattice mismatch, the interfacial layer 111 is formed between the high-K gate dielectric layer 112 and the semiconductor substrate 100. The interfacial layer 111 may be used as a buffer layer between the high-K gate dielectric layer 112 and the semiconductor substrate 100. Thus, possible defects caused by directly forming the high-K gate dielectric layer 112 on the semiconductor substrate 100 may be avoided. In certain other embodiments, the interfacial layer 111 may be omitted; and the high-K gate dielectric layer 112 may be directly formed on the semiconductor substrate 100.

The interfacial layer 111 may be made of any appropriate material, such as silicon oxide, silicon nitride, or silicon oxynitride, etc. In one embodiment, the interfacial layer 111 is made of silicon oxide. Various methods may be used to form the interfacial layer 111, such as a CVD process, a PVD process, an FCVD process, an ALD process, a thermal oxidation process or a chemical oxidation process, etc.

Because a subsequent etching process for removing the poly silicon dummy gate 114 may damage the high-K gate dielectric layer 112, the high-K gate dielectric protection layer 113 may be formed on the high-K gate dielectric layer 112 to prevent the high-K gate dielectric layer 112 from being damaged by the etching process. The high-K gate dielectric protection layer 113 may be made of one or more of TaN, TiN, TaSiN and TiAlN, etc. The high-K gate dielectric protection layer 113 may be a stacked layer consisting of one or more layers. Various methods may be used to form the high-K gate dielectric protection layer 113, such as a CVD process, a PVD process, an FCVD process, or an ALD process, etc.

In certain other embodiments, the high-K gate dielectric protection layer 113 may also be a portion of a work function layer. The work function of the MOS transistor may be adjusted by varying a thickness and material of the high-K gate dielectric protection layer 113.

A process for etching the gate dielectric material layer and the gate material layer and the etch back process may be a plasma etching process, an ion beam etching process, or a wet chemical etching process, etc.

A high-K gate dielectric layer may be formed either before forming the poly silicon dummy gate or after removing the poly silicon dummy gate. With the development of the IC manufacturing technology, the critical dimension of MOS transistors has also become smaller and smaller, a width of the poly silicon dummy gate may become smaller and smaller, thus the width of a trench formed by removing the poly silicon dummy gate may also become smaller and smaller. If the high-K gate dielectric layer is formed after removing the poly silicon dummy gate and before forming a metal gate, the high-K gate dielectric layer may be formed on the surfaces of the bottom and the sidewalls, and may consume a portion of the width of the trench. Thus, the final width of the trench used for forming the metal gate may become smaller; and the electrical characteristics of the metal gate may be significantly affected. Therefore, the high-K gate dielectric layer 112 may be formed before forming the poly silicon dummy gate 114; and a subsequently formed metal gate may have a relatively large width.

Further, as shown in FIG. 4, a sidewall spacer 118 may be formed around the poly silicon dummy gate structure 110. The sidewall spacer may be used as a mask for subsequently forming a source region and a drain region. The sidewall spacer 118 may be formed by any appropriate process.

Figure 5:
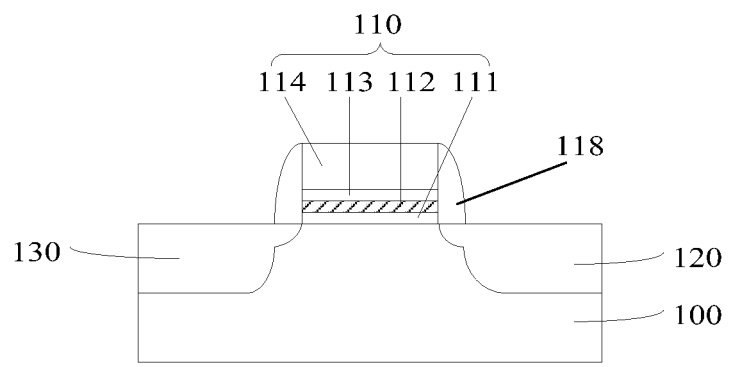

Returning to FIG. 10, after providing the semiconductor substrate 100 with the poly silicon dummy gate structure 110, a source region and a drain region may be formed in the semiconductor substrate 100 (S102). FIG. 5 illustrates a corresponding semiconductor structure.

As shown in FIG. 5, a source region 120 and a drain region 130 are formed in the semiconductor substrate at both sides of the poly silicon dummy gate structure 110. In one embodiment, the source region 120 and the drain region 130 may be formed by an ion implantation process. In certain other embodiments, stress material layers may be formed in the semiconductor substrate 100. The stress material layers may be made of any appropriate material, such as SiC, or SiGe, etc. By varying the composition and/or shape of the stress material layer, compression or stress may be generated in the channel region of a MOS transistor, thus a carrier mobility of the channel region may be increased; and the electric properties of the MOS transistor may be enhanced.

Figure 6:
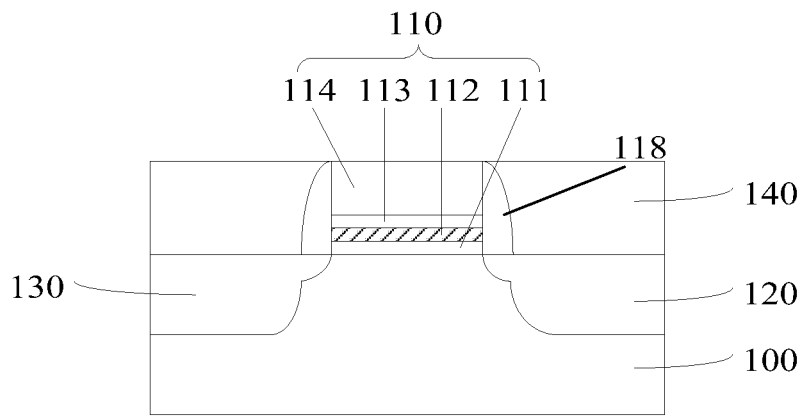

Returning to FIG. 10, after forming the source region 120 and the drain region 130, an interlayer dielectric layer may be formed on the semiconductor substrate 100 (S103). FIG. 6 illustrates a corresponding semiconductor structures.

As shown in FIG. 6, an interlayer dielectric layer 140 is formed on the semiconductor substrate 100. The surface of the interlayer dielectric layer 140 may level with the surface of the poly silicon dummy gate structure 110.

The interlayer dielectric layer 140 may be made of any appropriate material, such as silicon oxide, silicon nitride, or silicon oxynitride, etc. The interlayer dielectric layer 140 may also be low dielectric constant (low-K) material with a dielectric constant smaller than approximately 3.9, or ultralow-K material with a dielectric constant smaller than approximately 2.5, such as amorphous carbon, or silicon aero gel, etc. In one embodiment, the interlayer dielectric layer 140 is silicon oxide.

A process for forming the interlayer dielectric layer 140 may include forming an interlayer dielectric material layer on the semiconductor substrate 100 and the poly silicon dummy gate structure 110; and polishing the interlayer dielectric material layer until the top surface of the poly silicon dummy gate structure 110 is exposed and the top surface of the poly silicon dummy gate structure 110 levels with the surface of the interlayer dielectric layer 140. Various processes may be used to form the interlayer dielectric material layer, such as a CVD process, a PVD process, or an ALD process, etc. The interlayer dielectric material layer may be polished by a mechanical polishing process, or a chemical mechanical polishing (CMP) process, etc.

In certain other embodiments, a polishing stop layer may be formed on the semiconductor substrate 100 before forming the interlayer dielectric material layer. The polishing stop layer may be used to prevent the interlayer dielectric layer from being over polished, thus the height of a subsequently formed metal gate may be controlled. Further, compression or stress may be generated in the semiconductor substrate 100 after forming the polishing stop layer, the performance of the MOS transistor may be improved.

Figure 7:
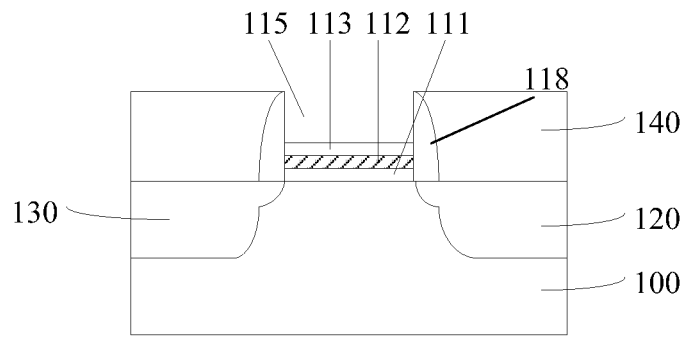

Returning to FIG. 10, after forming the interlayer dielectric layer 140, the poly silicon dummy gate 114 may be removed, and a trench may be formed (S104). FIG. 7 illustrates a corresponding semiconductor structure.

As shown in FIG. 7, a trench 115 is formed by removing the poly silicon dummy gate 114. The trench 115 may expose the high-K gate dielectric protection layer 113 containing nitrogen.

Various processes may be used to remove the poly silicon dummy gate 114, such as a dry etching process, or a wet etching process, or an ion beam etching process, etc. In one embodiment, the poly silicon dummy gate 114 is removed by a dry etching process. In certain other embodiments, a wet etching process may be used to remove the poly silicon dummy gate 114. Because the poly silicon dummy gate 114 is made of poly silicon, the interlayer dielectric layer 113 may be made of silicon oxide, an etching solution of the wet etching process may be a KOH solution, or a Tetramethylammonium hydroxide (TMAH) solution. Other appropriate etchant may also be used.

The high-K gate dielectric protection layer 113 containing nitrogen may be over etched by the wet etching process or the dry etching process for removing the poly silicon dummy gate 114. An over etching may damage nitrogen bonds of the high-K gate dielectric protection layer 113 containing nitrogen, thus a MOS transistor having such a high-K gate dielectric protection layer 113 may have a relatively large leakage current.

Returning to FIG. 10, after forming the trench 115, a nitrogen treatment process may be performed onto the high-K gate dielectric protection layer 113 containing nitrogen (S105). FIG. 8 illustrate a corresponding semiconductor device.

Referring to FIG. 8, a nitrogen treatment is performed onto the high-K gate dielectric protection layer 113 containing nitrogen to repair the damage caused by the wet etching process or the dry etching process for removing the poly silicon dummy gate 114. In one embodiment, the nitrogen treatment may be a thermal annealing process in a nitrogen environment or a nitrogen plasma treatment process, etc.

When the nitrogen treatment is an thermal annealing process, an environment gas may be nitrogen; a pressure of the reaction chamber may be in a range of approximately 2 mTorr~760 Torr; a flow of nitrogen may be in a range of approximately 10 sccm~5000 sccm; an annealing temperature may be in a range of approximately 200° C.~500° C.; and an annealing time may be in a range of approximately 5 s~30 s. In certain other embodiments, the environment gas may also be a mixture of nitrogen with one or more of helium and argon, etc.

The thermal annealing process may cause the nitrogen gas to diffuse into the high-K gate dielectric protection layer 113 containing nitrogen. Because a portion of the nitrogen bonds in the high-K gate dielectric protection layer 113 containing nitrogen may be damaged by the process for removing the poly silicon dummy gate 114. The nitrogen diffusing into the high-K gate dielectric protection layer 113 may repair the damaged nitrogen bonds. Thus, defects in the high-K gate dielectric protection layer 113 containing nitrogen may be significantly reduced; the gate tunneling current may also be reduced; and the leakage current of the MOS transistor having the high-K gate dielectric protection layer 113 containing nitrogen may be reduced.

Further, the thermal annealing process may cause the nitrogen to diffuse into the high-K gate dielectric layer 112. Because the high-K gate dielectric layer 112 may often be made of metal oxides; and the metal oxides may often have no fixed stoichiometry, even the interlayer dielectric layer 111 is formed between the high-K dielectric layer 112 and the semiconductor substrate 100, crystal lattice matches between the high-K dielectric layer 112 and the semiconductor substrate 100 may be still unable to match process requirements; and defects may still be possible to be formed between the interface of the high-K dielectric layer 112 and the semiconductor substrate 100. The bond energy of nitrogen may be greater than the bond energy of the metal ion of the metal oxide, thus when nitrogen bonds substitute the metal ion and oxygen vacancies of the metal oxide, the defects in the interface between the interface of the high-K dielectric layer 112 and the semiconductor substrate 100 may reduced; and the time dependent dielectric breakdown (TDDB) of the MOS transistor may be enhanced.

Further, the thermal annealing process may also cause the nitrogen to diffuse into the interfacial layer 111; and cause silicon oxide to be converted into silicon oxynitride, the equivalent inverse oxide thickness ($T_{inv}$) of a MOSFET may be decreased.

In certain other embodiments, a plasma treatment process may be used to perform the nitrogen treatment process. A gas source of the plasma treatment process may be nitrogen. The nitrogen may be ionized, and may be converted into plasma containing nitrogen ions. The plasma containing nitrogen ions may be used to perform the nitrogen treatment process onto the high-K gate dielectric protection layer 113. A radio frequency power of the plasma treatment process may be in a range of approximately 100 W~2000 W; a flow of nitrogen may be in a range of approximately 10 sccm~500 sccm; a pressure of the reaction chamber may be in a range of approximately 4 mTorr~50 mTorr; a temperature of the reaction chamber may be in a range of approximately 40° C.~80° C.; and a plasma treatment time may be in a range of approximately 30 s~200 s. In certain other embodiments, the gas source of the plasma treatment process may also be a mixture of nitrogen with one or more of He and Ar, etc.

The plasma treatment process may cause the nitrogen to diffuse into the high-K gate dielectric protection layer 113 to repair the damages of nitrogen bonds caused by the process for removing the poly silicon gate 114. Thus, defects in the high-K gate dielectric protection layer 113 may be significantly reduced; and the tunneling current of the MOS transistor may be reduced as well. Therefore, the leakage current of the MOS transistor may be reduced.

Further, the plasma treatment process may also cause the nitrogen to diffuse into the high-K gate dielectric layer 112. Because the high-K gate dielectric layer 112 may often be made of metal oxides; and the metal oxides may often have no fixed stoichiometry. Thus, even the interlayer dielectric layer 111 is formed between the high-K dielectric layer 112 and the semiconductor substrate 100, crystal lattice matches between the high-K dielectric layer 112 and the semiconductor substrate 100 may be still unable to match process requirements; and defects may still be possible to be formed between the interface of the high-K dielectric layer 112 and the semiconductor substrate 100. The bond energy of nitrogen may be greater than the bond energy of the metal ion of the metal oxide, thus when nitrogen bonds substitute metal ions and oxygen vacancies of the metal oxide, defects in the interface between the interface of the high-K dielectric layer 112 and the semiconductor substrate 100 may reduced; and the time dependent dielectric breakdown (TDDB) of the MOS transistor may be enhanced.

Further, the plasma treatment process may also cause the nitrogen to diffuse into the interfacial layer 111; and cause silicon oxide to be converted into silicon oxynitride, the equivalent inverse oxide thickness ($T_{inv}$) of a MOSFET may be decreased.

Returning to FIG. 10, after the nitrogen treatment process, a metal gate structure may be formed (S106). FIG. 9 illustrates a corresponding semiconductor structure.

As shown in FIG. 9, a metal gate structure 116 is formed in the trench 115. The metal gate structure 116 may include a work function layer 117 and a metal gate 119. The work function layer 117 may be used to adjust the work function of the MOS transistor. The work function layer 117 may also be used as a diffusion barrier layer. The diffusion barrier layer may be used to prevent the metal in the metal gate 119 from diffusing into the interlayer dielectric layer 140, a short circuit and/or a breakdown of the interlayer dielectric layer 140 may be avoided.

A process for forming the metal gate structure 116 may include forming a work function material layer (not shown) on the sidewalls and the bottom of the trench 115; forming a metal material layer (not shown) on the work function material layer; and polishing the work function material layer and the metal material layer on the interlayer dielectric layer 140 until the top surface of the interlayer dielectric layer 140 is exposed using a chemical mechanical polishing (CMP) process. Thus, the work function layer 117 and the metal gate 119 are formed.

The work function layer 117 may be made of one or more of Ta, Ti, TaN, TiN, TaSiN, and TiAlN, etc. Other appropriate material may also be used for the work function material layer. Various processes may be used to form the work function layer 117, such as a PVD process, a CVD process, an ALD process, or an FCVD process, etc.

The metal gate 118 may be made of one or more of Al, Cu, Ti, Ag, Au, Pt and Ni, etc. Other appropriate material may also be used for the metal material layer. Various processes may be used to form the metal gate 118, such as a PVD process, a CVD process, an ALD process, a sputter process, or an electrodeposition process, etc.

Optionally, an extra diffusion barrier layer may be formed between the work function layer 177 and the metal gate 118. The diffusion barrier layer may be used to prevent the metal in the metal layer from diffusing into the interlayer dielectric layer 140.

Thus, a MOS transistor may be formed by above disclosed methods and processes; and a corresponding MOS transistor is illustrated in FIG. 9. As shown in FIG. 9, the MOS transistor includes a semiconductor substrate 100, and a source region 120 and a drain region 130 in the semiconductor substrate 100. The MOS transistor also includes an interfacial layer 111, a high-K gate dielectric layer 112 and a metal gate structure 116 having a work function layer 117 and a metal gate 119. Further, the MOS transistor includes a high-K gate dielectric protection layer 113 repaired by a nitrogen treatment process between the metal gate structure 116 and the high-K dielectric layer 112. Further, the MOS transistor also includes an interlayer dielectric layer 140 on the semiconductor substrate 100 and a sidewall spacer 118. The detailed structures and intermediate structures are described above with respect to the fabrication processes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a MOS transistor, comprising:
   providing a semiconductor substrate;
   forming a ploy silicon dummy gate structure having a high-K gate dielectric layer on the semiconductor substrate, a high-K gate dielectric protection layer containing nitrogen on the high-K gate dielectric layer and a poly silicon dummy gate on the high-K gate dielectric protection layer on the semiconductor substrate;
   forming a source region and a drain region in the semiconductor substrate at both sides of the poly silicon dummy gate structure;
   removing the poly silicon dummy gate to form a trench exposing the high-K gate dielectric protection layer containing nitrogen;
   performing a nitrogen treatment process to repair defects in the high-K gate dielectric protection layer containing nitrogen caused by removing the poly silicon dummy gate; and
   forming a metal gate structure in the trench.

2. The method according claim 1, wherein performing a nitrogen treatment process further includes:
   diffusing nitrogen gas into the high-K gate dielectric protection layer containing nitrogen to repair damaged nitrogen bonds caused by a process for removing the poly silicon dummy gate.

3. The method according claim 1, wherein to repair damaged nitrogen bonds further includes:
   provided that the high-K gate dielectric layer contains metal oxides, diffusing nitrogen gas into the high-K gate dielectric layer substitute metal ions and oxygen vacancies of the metal oxide with nitrogen bonds, provided that the high-K gate dielectric layer contains metal oxides.

4. The method according to claim 1, wherein forming the poly silicon dummy gate further includes:
   forming a sidewall spacer around the poly silicon dummy gate structure.

5. The method according to claim 1, wherein:
the nitrogen treatment process is a thermal annealing process in a nitrogen environment, or a nitrogen plasma process.

6. The method according to claim 1, wherein forming the poly silicon dummy gate further includes:
forming a high-K gate dielectric material layer on the semiconductor substrate;
forming a high-K gate dielectric protection material layer containing nitrogen on the high-K gate dielectric layer;
forming a poly silicon layer on the high-K gate dielectric protection material layer; and
etching the high-K gate dielectric material layer, the high-K gate dielectric protection material layer and the poly silicon layer.

7. The method according to claim 1, wherein:
The high-K gate dielectric layer is made of $HfO_2$, $La_2O_3$, HfSiON, or $HfAlO_2$.

8. The method according claim 1, wherein forming the metal gate structure further includes:
forming a diffusion barrier layer between the high-K gate dielectric protection layer and the metal gate structure.

9. The method according to claim 8, wherein:
an annealing gas of the thermal annealing process is nitrogen;
a pressure of the reaction chamber of the thermal annealing process is in a range of approximately 2 mTorr~760 mTorr;
a flow of nitrogen of the thermal annealing process is in a range of approximately 10 sccm~5000 sccm;
an annealing temperature of the thermal annealing process is in a range of approximately 200° C.~500° C.; and
a thermal annealing time is in a range of approximately 30 s~200 s.

10. The method according to claim 8, wherein:
a power of the radio frequency plasma of the nitrogen plasma process is in a range of approximately 100 W~2000 W;
a flow of nitrogen is in a range of approximately 10 sccm~500 sccm;
a pressure of the reaction chamber of the nitrogen plasma process is in a range of approximately 4 mTorr~50 mTorr;
a temperature of the reaction chamber of the nitrogen plasma process is in a range of approximately 40° C.~80° C.; and
a treatment time of the plasma process is in a range of approximately 30 s~200 s.

11. The method according to claim 1, before removing the poly silicon dummy gate, further including:
forming an interlayer dielectric layer with the top surface leveling with the top surface of the poly silicon dummy gate structure on the semiconductor substrate; and
forming an etching stop layer on the semiconductor substrate and the poly silicon dummy gate structure.

12. The method according to claim 11, wherein:
an annealing gas of the thermal annealing process is a mixture of nitrogen with one or more of helium and argon.

13. The method according to claim 12, before forming the high-K gate dielectric layer, further including:
forming an interfacial layer on the semiconductor substrate.

14. The method according to claim 1, wherein
the high-K gate dielectric protection layer containing nitrogen is made of one or more of TaN, TiN, TaSiN and TiAlN.

15. The MOS transistor according to claim 14, wherein:
an interfacial layer is formed between the high-K gate dielectric layer and the semiconductor substrate;
a work function layer is formed between the high-K gate dielectric protection layer and the metal gate; and
a diffusion barrier layer is formed between the work function layer and high-K gate dielectric protection layer.

16. The MOS transistor according to claim 14, wherein:
the nitrogen treatment process is a thermal annealing process in a nitrogen environment or a nitrogen plasma process.

17. The MOS transistor according to claim 14, wherein:
the high-K gate dielectric protection layer containing nitrogen is made of one or more of TaN, TiN, TaSiN, and TiAlN.

18. The MOS transistor according to claim 14, wherein:
the high-K gate dielectric layer is made of $HfO_2$, $La_2O_3$, $HfSiO_3$, HfSiON, or $HfAlO_3$.

19. The MOS transistor according to claim 14, wherein:
the metal gate is made of one or more of Al, Cu, Ti, Ag, Au, Pt and Ni.

20. A MOS transistor, comprising:
a semiconductor substrate;
a high-K metal gate structure having a high-K gate dielectric layer on the semiconductor substrate, a high-K gate dielectric protection layer containing nitrogen on the high-K gate dielectric layer and a metal gate structure on the high-K gate dielectric protection layer;
a source region and a drain region at both sides of the high-K metal gate structure in the semiconductor substrate; and
an interlayer dielectric layer on the semiconductor substrate,
wherein the high-K metal gate structure is formed by:
forming a poly silicon dummy gate structure on the semiconductor substrate;
removing a poly silicon dummy gate of the poly silicon dummy gate structure to form a trench exposing the high-K gate dielectric protection layer containing nitrogen;
performing a nitrogen treatment process to repair defects in the high-K gate dielectric protection layer containing nitrogen caused by removing the poly silicon dummy gate; and
forming a metal gate structure in the trench.

* * * * *